United States Patent
Shimoyama et al.

(10) Patent No.: US 6,265,733 B1
(45) Date of Patent: *Jul. 24, 2001

(54) SEMICONDUCTOR DEVICE AND METHOD FOR MANUFACTURING THE SAME

(75) Inventors: Kenji Shimoyama; Kazumasa Kiyomi; Hideki Gotoh; Satoru Nagao, all of Ushiku (JP)

(73) Assignee: Mitsubishi Chemical Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/970,145

(22) Filed: Nov. 13, 1997

Related U.S. Application Data (63) Continuation of application No. 08/547,912, filed on Oct. 25, 1995, now abandoned.

(30) Foreign Application Priority Data

| Oct. 26, 1994 | (JP) | 6-262837 |
| Oct. 26, 1994 | (JP) | 6-262838 |
| Oct. 26, 1994 | (JP) | 6-262839 |

(51) Int. Cl.[7] .................................................. H01L 33/00
(52) U.S. Cl. ................................. 257/94; 257/13; 257/14
(58) Field of Search .................................. 257/14, 13, 15, 257/17, 22, 28, 30, 94; 372/48

(56) References Cited

U.S. PATENT DOCUMENTS

| 4,504,952 | * | 3/1985 | Hartman et al. ........................ 372/45 |
| 5,138,625 | * | 8/1992 | Paoli et al. ............................ 372/46 |
| 5,258,326 | * | 11/1993 | Morishima et al. .................. 437/107 |
| 5,313,484 | * | 5/1994 | Arimoto ................................ 372/46 |

FOREIGN PATENT DOCUMENTS

| 0 469 712 A1 | 2/1992 | (EP) . |
| 2 271 466 | 4/1994 | (GB) . |

OTHER PUBLICATIONS

Shigenobu et al.; Patent Abstracts of Japan; "Semiconductor Device and Manufacture Thereof"; vol. 13, No. 346 (E–798), Aug. 3, 1989.

Simhony et al.; "Vertically Stacked Multiple–Quantum-–Wire Semiconductor Diode Lasers"; Appl. Phys. Lett. 59 (18), p.2225–7; 1991; American Institute of Physics.

* cited by examiner

*Primary Examiner*—Olik Chaudhuri
*Assistant Examiner*—Douglas A. Wille
(74) *Attorney, Agent, or Firm*—Armstrong, Westerman, Hattori, McLeland & Naughton, LLP (57) ABSTRACT

The semiconductor device according to the present invention comprises a V-groove having V-shaped cross-section formed on a semiconductor substrate or on an epitaxial growth layer grown on a semiconductor substrate, and an active layer is provided only at the bottom of said V-groove. The method for manufacturing a semiconductor device according to the present invention comprises the steps of forming a stripe-like etching protective film in <011> direction of a semiconductor substrate or an epitaxial growth layer grown on it, performing gas etching using hydrogen chloride as etching gas on a semiconductor substrate or on an epitaxial growth layer grown on a semiconductor substrate to form a V-groove, and forming an active layer at the bottom of said V-groove.

16 Claims, 8 Drawing Sheets

SEMICONDUCTOR DEVICE AND METHOD FOR MANUFACTURING THE SAME

This application is a continuation of application Ser. No. 08/547,912 filed Oct. 25, 1995, now abandoned.

BACKGROUND OF THE INVENTION

The present invention relates to a semiconductor device, and in particular to a semiconductor device utilizing quantum effect.

A semiconductor device having a quantum microstructure such as quantum well, quantum wire, quantum box, etc. is preferably used as a semiconductor light emitting device, and it exhibits excellent characteristics such as low threshold current, high modulation band, high coherence characteristics, etc. through quantum effect of electrons and holes. Further, such effects are remarkably noted in case distortion lower than critical film thickness is introduced to an active layer.

Figure 8:
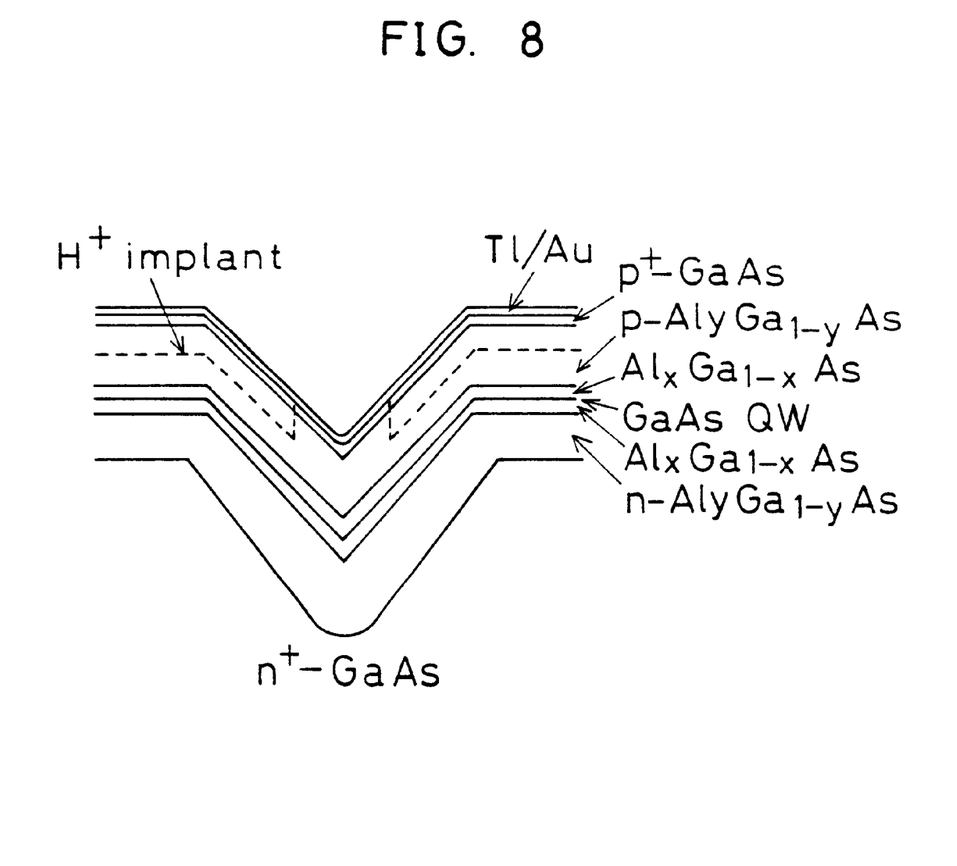
FIG. 8 is a schematical drawing of a typical cross-section of an element using a conventional type quantum wire.

The methods to prepare quantum wires are as follows: a method to prepare quantum well structure and to obtain quantum wires by combining fine photolithography using electron beam exposure with vertical etching using ion beam, and a method to provide a V-shaped groove on a substrate as shown in FIG. 8 and to grow double hetero structure over the entire substrate surface having a groove with V-shaped cross-section (hereinafter referred as "V-groove").

However, the former method is disadvantageous in that side walls of the groove may be extensively damaged during fabrication and the quantum wires are often in poor quality.

On the other hand, the latter method has advantages in that quantum wires ran be selectively prepared by utilizing dependency of the growing speed on orientation, while it has drawbacks in that the bottom of the formed V-groove may be rounded depending upon the composition of the portion to form the V-groove, or oxide film is formed on the etching surface or contamination is caused by impurities during wet etching, or the bottom of V-groove is rounded due to etching.

Because quantum wire is a minute area, optical density on the light outgoing side tends to increase extremely when applied on laser structure, and only very weak light output can be obtained.

In a microstructure such as quantum wire, more quantum effects are present in thick film than in plane, and this is convenient to have high gain. When it is attempted to grow a distortion active layer with lattice mismatch ratio of 1 to 2% where the effect of distortion appears on flat substrate surface, the film thickness, at which dislocation starts to occur, i.e. critical film thickness, is only in the order of 10 to 20 nm because stress is applied on all over the surface of the distortion active layer. Thus, it is often not possible to have thick distortion active layer when it is to be utilized as quantum wire.

For this reason, it is an object of the present invention to provide a structure, in which quantum wires with good quality can be easily obtained, and a method to prepare such a structure.

It is another object of the present invention to improve efficiency of a semiconductor device.

SUMMARY OF THE INVENTION

After having elaborately studied, the present inventors have found that the above problems can be solved by forming a V-groove having V-shaped cross-section on a semiconductor substrate or on an epitaxial growth layer grown on a semiconductor substrate and by providing an active layer only at the bottom of said V-groove.

Specifically, the present invention provides a semiconductor device having a V-groove with V-shaped cross-section on a semiconductor substrate or on an epitaxial growth layer grown on a semiconductor substrate, and an active layer is provided only at the bottom of said V-groove. The invention also provides a semiconductor device, which is manufactured by the steps of forming a stripe-like etching protective film in <011> direction of a semiconductor substrate or of an epitaxial growth layer, performing gas etching using hydrogen chloride as etching gas on a semiconductor substrate or on an epitaxial growth layer grown on a semiconductor substrate to form a V-groove, and forming an active layer at the bottom of said V-groove. The invention also provides a method for manufacturing said semiconductor device.

DESCRIPTION OF THE PREFERRED EMBODIMENTS

In the following, detailed description will be given on the present invention.

The structure of a semiconductor device according to the present invention can be preferably used for III–V compound semiconductor and II–VI compound semiconductor. The structure according to the present invention is preferably used as an electronic element utilizing conduction of carriers in an active region, or more preferably, it is used as a light emitting semiconductor device.

Figure 1:
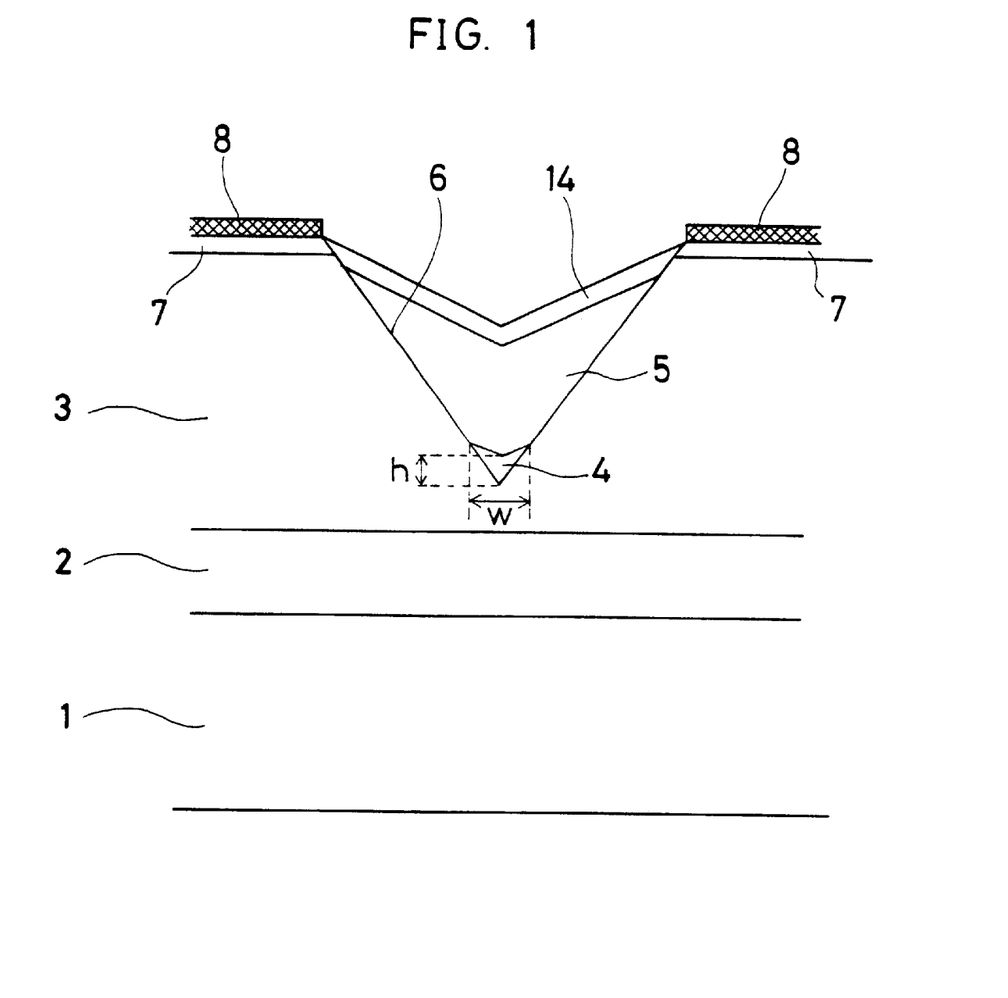
FIG. 1 is a schematical drawing of longitudinal section of a semiconductor device manufactured in embodiments 1 and 2 of the present invention.
Figure 2A:
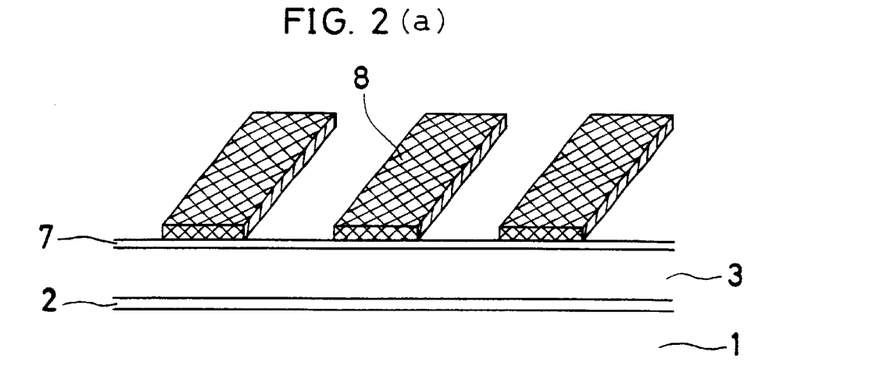
FIG. 2 represents manufacturing processes of a semiconductor device according to the present invention.
Figure 2B:
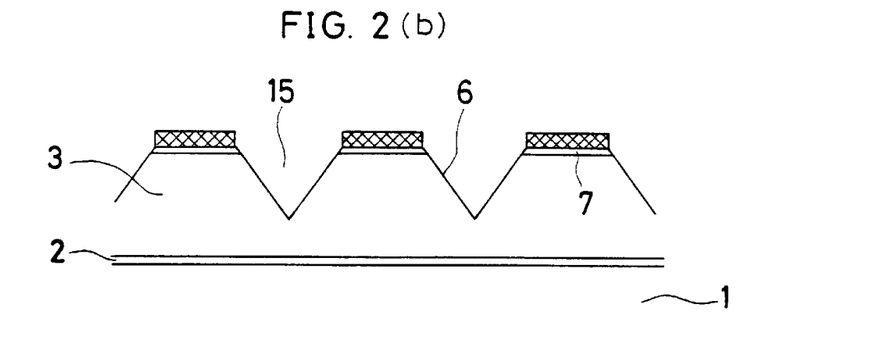
Figure 2C:
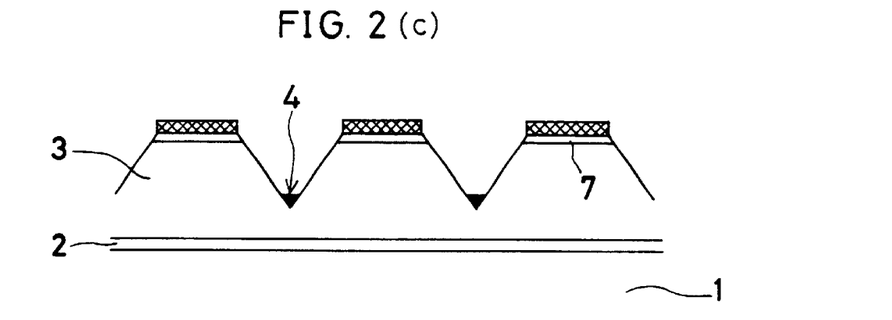
Figure 2D:
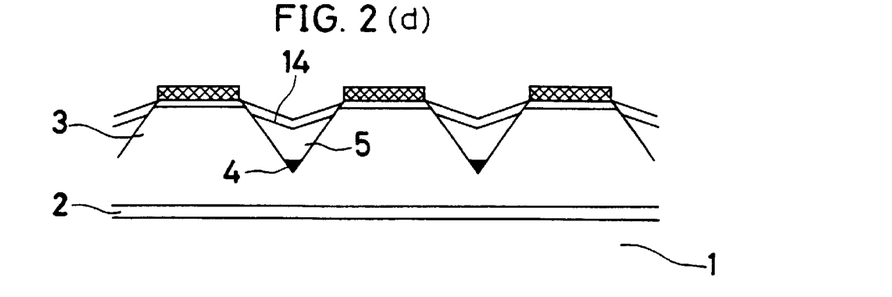

Description is now given on the structure of the semiconductor device of the present invention, referring to the device in FIG. 1 where the structure is grown on (100) face GaAs substrate of III–V compound prepared in the embodiment.

The (100) face is used because symmetry or rectilinearity of quantum well is under influence of symmetry and rectilinearity of V-groove and the most advantageous orientation is selected. A substrate of any orientation may be used unless there is extreme influence of symmetry and rectilinearity of quantum well. Of course, the same applies to off-angle orientation. The V-groove of the present invention is provided on a substrate or on an epitaxial layer grown on a substrate. The direction of the V-groove is preferably deviated by less than 10° from <011> direction, or more preferably by less than 5°. If it is deviated by more than 10° from <110> direction, the sides of the V-groove tend to be in form of notched steps, and this is not very desirable.

An active layer 4 is formed on a portion at the bottom of the V-groove. In case a quantum well structure is used as the active layer, the thickness "h" of the active layer 4 is preferably 50 nm or less for the use as quantum wires, or more preferably 20 nm or less. The linewidth "w" of the active layer is preferably 200 nm or less, or more preferably 50 nm or less. With regard to the composition and conductivity type of the active layer, any composition or type as commonly used may be applied, and there is no special restriction.

Because the active layer is provided at the bottom of the V-groove, finer quantum wires can be prepared.

In a preferable aspect of the present invention, the active layer is sandwiched between a cladding layer 5 inside the V-groove and a cladding layer 3 outside the V-groove, the two layers being in contact with each other on the side of the V-groove. It is preferable that energy gap of the cladding layer 3 outside V-groove is greater than energy gap of the cladding layer 5 inside V-groove. By adopting such a structure, it is possible to concentrate electric current on the active layer at the bottom of V-groove. Accordingly, the semiconductor device of the present invention is preferably used for the applications such as laser diode. In FIG. 1, reference numeral 6 represents {111} 6 face, while 7 and 14 each represents a cap layer, and 8 represents a silicon nitride film.

Figure 3:
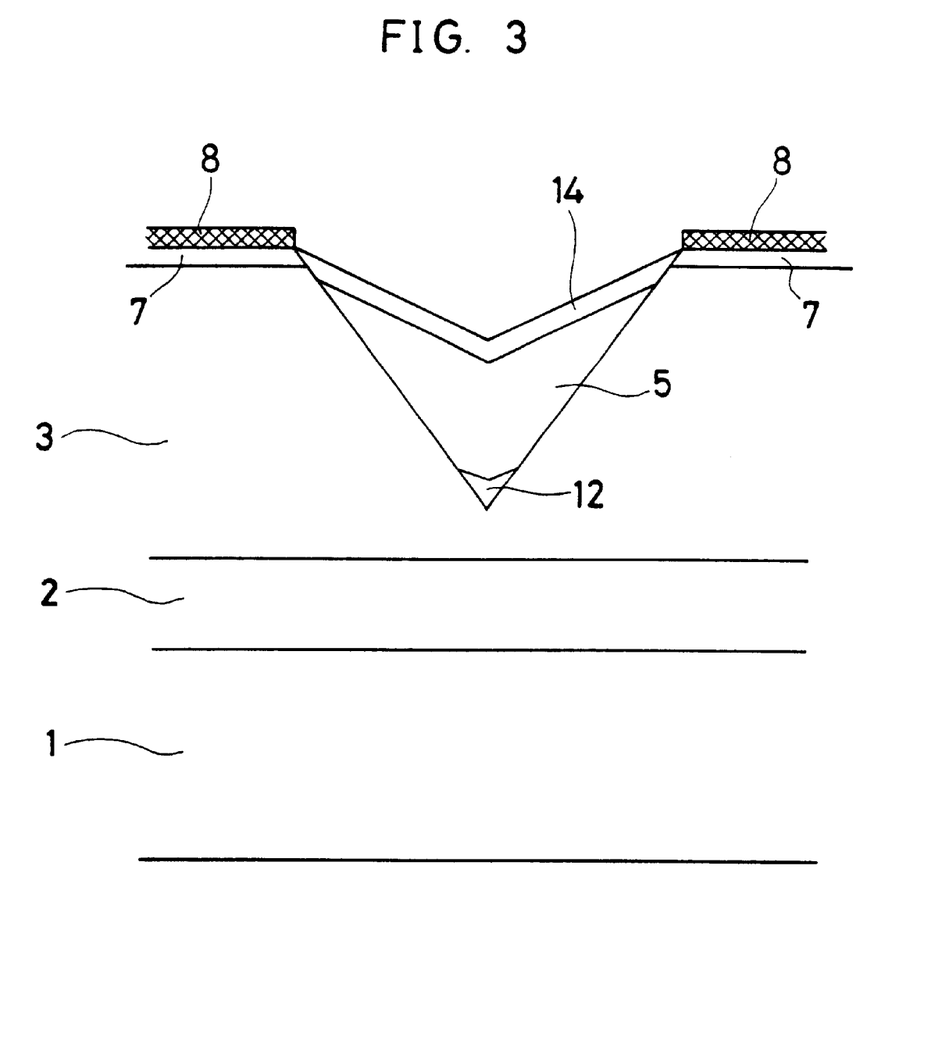
FIG. 3 represents a schematical drawing of longitudinal cross-section of a semiconductor device manufactured in embodiments 3 and 4 of the present invention.

Also, as shown in FIG. 3, the active layer may have distortion. In FIG. 3, the active layer 12 having distortion is less restricted in material selection in relation to lattice mismatch with the substrate or other single crystal layer and is also less influenced by dislocation. However, when it is grown on a flat surface, it is difficult to obtain an active layer with thick film. When the distortion active layer 12 is grown locally as in the present invention, less stress is applied on the distortion active layer 12, and it is possible to obtain the distortion active layer 12 with thick film.

Figure 4:
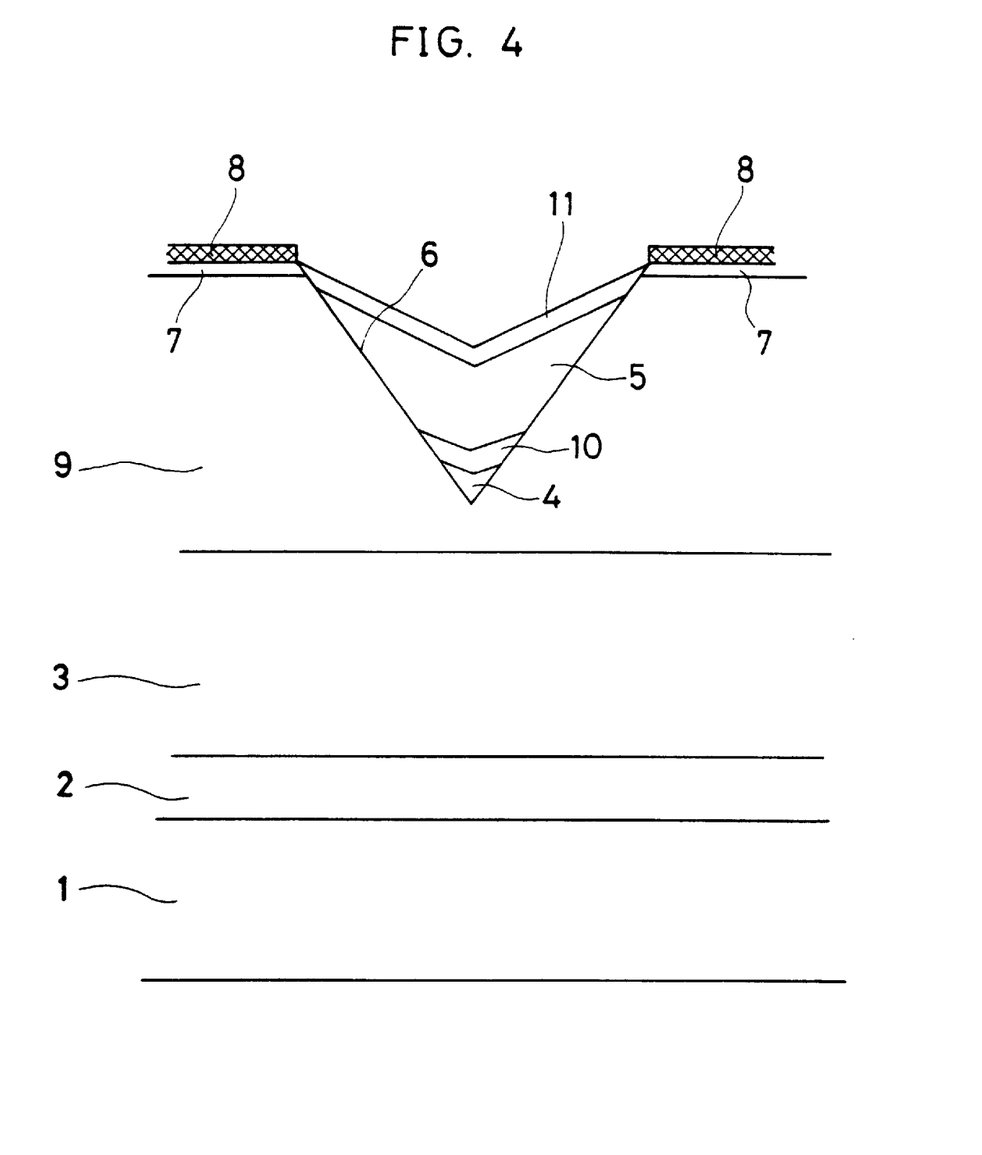
FIG. 4 represents a schematical drawing of longitudinal cross-section of a semiconductor device manufactured in embodiment 5 of the present invention.

As shown in FIG. 4, an optical guiding layer 10 having refractive index lower than that of the active layer but higher than that of the cladding layer may be formed between the active layer 4 and the cladding layer 5 inside the V-groove. In this case, a quantum wire having the better light emitting characteristics can be obtained. By adopting such a structure, light from laser beam generated by recoupling of electrons and holes in the active layer, which comprises the quantum wire, comes out around the quantum wire, and this makes it possible to increase light output.

Figure 5:
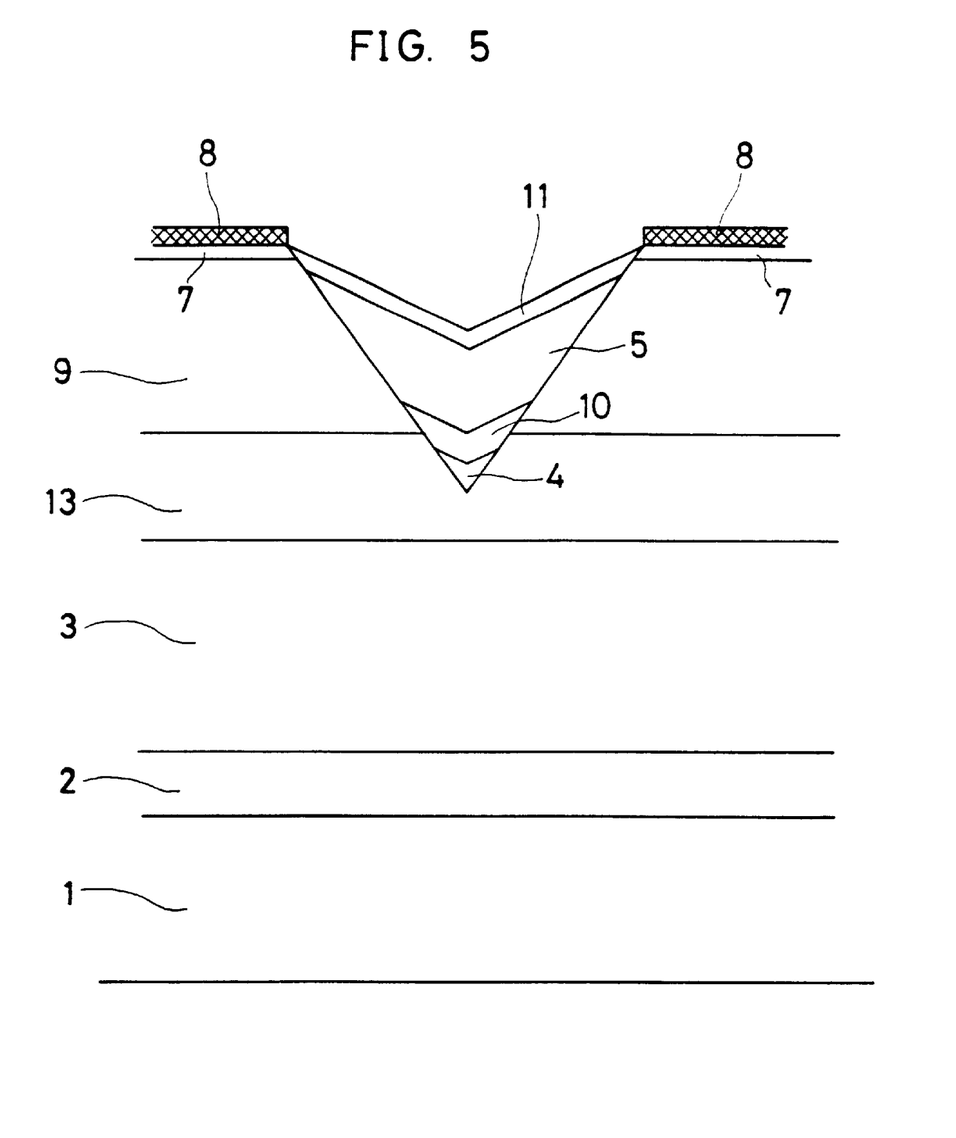
FIG. 5 represents a schematical drawing of longitudinal cross-section of a semiconductor device manufactured in embodiment 6 of the present invention.

In the other method to increase light emitting characteristics as shown in FIG. 5, a double hetero structure, which has a first optical guiding layer 13 with higher refractive index sandwiched in vertically between a first cladding layer 3 and a second cladding layer, both layers having lower refractive indices, is grown epitaxially in form of a semiconductor substrate, and a V-groove is formed on the epitaxial growth layer of double hetero structure, whereby the active layer 4 at the bottom of V-groove is in contact with the first optical guiding layer 13 on the side of the V-groove. In this case, too, it is preferable that an optical guiding layer 10 (a second optical guiding layer) is present between the active layer 4 at the bottom of the V-groove and a cladding layer 5 (a third cladding layer) inside the V-groove on upper portion of the active layer. In this case, if refractive index of the first optical guiding layer 13 is equal to that of the second optical guiding layer 10, it is much easier to obtain a circular beam with good symmetry. Further, it is preferable that the first cladding layer 3 and the first optical guiding layer 13 are of the same conductivity type, that the third cladding layer 5 and the second optical guiding layer 10 are of the same second conductivity type, and that the second cladding layer 9 is of the second conductivity type or has higher resistance. By adopting such a structure, it is possible to concentrate electric current on the active layer at the bottom of the V-groove, and this is suitable for the applications in laser diode.

In case of a light emitting device, it is preferable that the cladding layer 5 inside V-groove and the cladding layer 3 outside V-groove are different in conductivity types, and that the cladding layer 5 inside V-groove and the optical guiding layers 10 and 13 are of the same conductivity type.

It is preferable that the V-groove of the present invention is formed by vapor phase etching. This is because, if V-groove is formed by wet etching as in the conventional procedure, the bottom of the V-groove tends to be rounded, and impurities often remain on the etched surface or oxide film is formed, and this makes it difficult to obtain an active layer with good quality even when the active layer is provided in contact with the etching surface.

The method to manufacture a V-groove having V-shaped cross-section, which is one of the features of the semiconductor device of the present invention, is as follows:

The V-groove may be in such a structure that it has no longitudinal length such as inverted pyramid.

If the semiconductor substrate is made of a material, which can be used as a cladding layer, it may used as it is. Normally, however, a layer to become the cladding layer 3 outside the V-groove is first epitaxially grown on the semiconductor substrate. In this case, it is preferable to use organic metal vapor phase growth method (MOCVD method). The layers to be epitaxially grown include, in addition to the cladding layer 3, a buffer layer 2 provided between the substrate and the cladding layer so that impurities or defects in early stage of growth do not reach the light emitting layer, an optical guiding layer 10 provided on the cladding layer 3 with the purpose of increasing light output, a high resistance cladding layer 9 for confining electric current within the V-groove, and a cap layer 7 for preventing oxidation and protecting the surface.

On this epitaxial wafer surface, a stripe-like etching preventive film is formed using patterning process such as photolithography. As the etching preventive film, any type already known may be used, and it is preferable to use a silicon nitride film 8, a silicon oxide film, etc. In this case, it is preferable that the direction of the stripe of the etching preventive film is in <110> direction.

Thereafter, using the etching preventive film as mask and HCl as etching gas, in-site gas etching of the semiconductor substrate or the epitaxial layer is performed, and a V-groove with sharp edge is formed. Using HCl as the etching gas, the side of the V-groove is turend to a {111} B face 6. Besides HCl, a gas having at least one type of halogen element such as hydrogen bromide, arsenic trichloride, phosphorus trichloride, chlorine, etc. may be used as the etching gas, and it is possible to obtain a V-groove, which has the side as {111} B face as in the case where HCl is used.

Etching may be carried out in an independent reaction chamber, but it is preferable that the substrate is placed in a reactor for organic metal vapor phase growth method and the etching gas is introduced in the reactor because the active layer and the cladding layer can be grown continuously without exposing the substrate to the air. By this method, an active layer with good quality can be obtained even when the active layer is directly grown on the etching surface because the impurities do not remain on the etching surface or oxide film is not formed.

Further, an active layer is then formed in the V-groove, and MOMBE, CBE, etc. may be applied for this purpose, while it is preferable to use the organic metal vapor phase growth method. In this case, no crystal growth occurs from the side of the V-groove because the side of the V-groove is a {111} B face. The generated active layer material remains at the bottom of the V-groove, and the active layer is formed only at the bottom.

It is preferable that inclination of the V-groove is on the {111} B face. The {111} B face is defined as a {111} face where only V compounds are aligned on the surface in case of III–V compound semiconductor, and as a {111} face where only VI compounds are aligned on the surface in case of II–VI compound semiconductor. This is because steric hindrance of V atoms occur or V/III>1 on the {111} B face, and crystal growth is mostly unlikely to occur and growth is easily started from the bottom of the V-groove.

Subsequent to the formation of the active layer, a cladding layer is grown on upper portion of the active layer within the V-groove. Also, when necessary, a cap layer for preventing oxidation and protection on the surface of the growth layer within V-groove and a contact layer for decreasing contact resistance during electrode formation may be formed.

In the following, more detailed description will be given on the present invention referring to embodiments, whereas the invention is not limited to these embodiments, and it is needless to say that changes and modifications can be made without deviating from the spirit and the scope of the present invention.

(EXAMPLE 1)

First, on a (100) GaAs substrate 1, a GaAs buffer layer 1 (0.5 $\mu$m), $Al_{0.5}Ga_{0.5}As$ cladding layer 3 (2 $\mu$m) and a GaAs cap layer 7 (20 nm) were formed by MOCVD method in this order. On the surface of this epitaxial substrate, silicon nitride film was formed by PCVD method, and the surface was masked by photolithography method and plasma etching method in such manner that the silicon nitride film 8 ($SiN_x$) of 1 $\mu$m in width extending in [011] direction was aligned at every 1 $\mu$m (FIG. 2($a$)). This stripe-like $SiN_x$ film is used as a protective mask for gas etching and selective growth. The masked sample was set again to the MOCVD system. After setting, temperature was raised to 700° C. under arsine ($AsH_3$) atmosphere. Then, etching was performed using HCl gas, and a V-groove of 0.7 $\mu$m in depth having the {111} B faces 6 on both sides was formed (FIG. 2($b$)). Immediately after the etching was stopped, trimethyl gallium (TMG) was supplied with the temperature maintained at 700° C., and a GaAs quantum wire active layer 4 was formed in the V-groove (FIG. 2($c$)). Further, trimethyl aluminum (TMA) was supplied simultaneously with TMG, and an $Al_{0.5}Ga_{0.5}As$ cladding layer 5 of 0.5 $\mu$m was formed. Next, the supply of TMA was stopped and a GaAs cap layer 7 of 10 nm was formed (FIG. 2($d$)). In this case, the {111} B face is selectively formed by gas etching because etching proceeds much slower on this face compared with the other faces. Because epitaxial growth is difficult to perform on the {111} B face, no growth occurs on the side wall of the V-groove. As a result, GaAs quantum wire is self-matchingly formed at the bottom of the V-groove. By supplying HCl at a rate of about 1 sccm, i.e. by the same number of mols as III raw material even during the growth, deposition of AlGaAs polycrystal on the silicon nitride film 8 was prevented. This method to supply HCl during growth is preferably used in case aluminum composition in the GaAlAs layer is 0.4 or more. This enables seletive growth of AlGaAs having high aluminum composition, and this is effective for confinement of carriers to the quantum wire actively layer 4.

Figure 6:
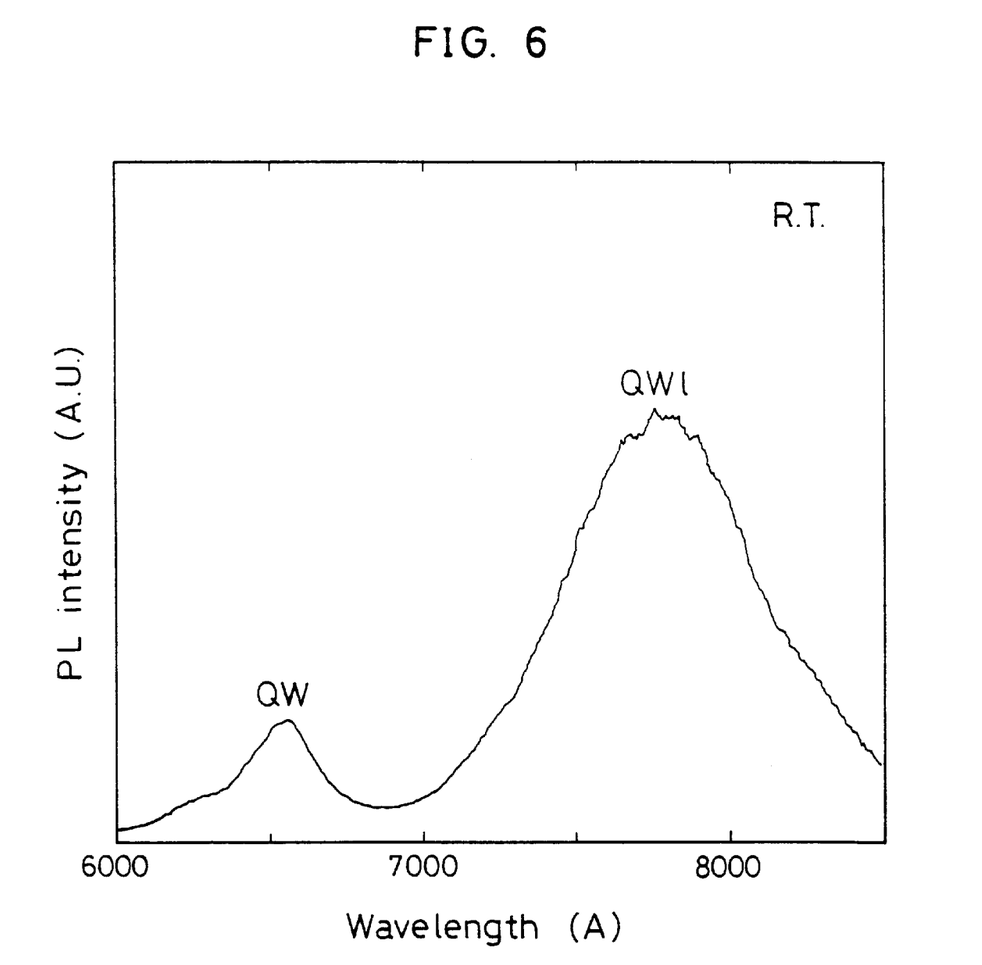
FIG. 6 represents a status of PL light emission at room temperature of a sample prepared in the embodiment 1 of the semiconductor device of the present invention.

The sample thus grown was examined under scanning electron microscope. FIG. 1 schematically shows how it looked. Under-etching phenomenon with the etching extending under the mask of silicon nitride was not observed, and a V-groove with sharp edge could be formed. Only at the bottom of the V-groove, a GaAs wire of 9 nm in height (h) and 20 nm in lateral width (w) at the tip was buried. When PL (photoluminescence) of this sample was examined, light emission from the quantum wire was conspicuously observed at 77 K and at room temperature (300 K). FIG. 6 shows the data at room temperature. These results suggest quantum wire of high quality and with fewer damage can be easily obtained.

(EXAMPLE 2)

A sample was prepared by the same procedure as in Example 1 except that the composition of the cladding layer 5 inside the V-groove was $Al_{0.3}Ga_{0.7}As$, and light emission intensity was examined. Apparently, light emission intensity increased. This may be attributable to the fact that carriers in V-groove could not go out of V-groove and was concentrated on the active layer 4 at the bottom of V-groove because energy barrier is present on the side wall of V-groove. It appears that such effect is advantageous when preparing a laser element and the like.

(EXAMPLE 3)

First, on a (100) GaAs substrate 1, a GaAs buffer layer 2 (0.5 $\mu$m), an $Al_{0.5}Ga_{0.5}As$ cladding layer 3 (2 $\mu$m), and a GaAs cap layer 7 (20 nm) were formed by MOCVD method in this order. On the surface of this epitaxial substrate, silicon nitride film was formed by PCVD method, and the surface was masked by photolithography method in such manner that the silicon nitride film 8 of 1 $\mu$m in width extending in the [011] direction was aligned at every 1 $\mu$m. The masked sample was set again on the MOCVD system. After setting, temperature was raised to 700° C. under arsine ($AsH_3$) atmosphere. Then, etching was performed using HCl, and a V-groove of 0.7 $\mu$m in depth having the {111} B faces 6 on both sides was prepared. Immediately after the etching was stopped, trimethyl gallium (TMG) and trimethyl indium (TMI) were supplied with the temperature maintained at 700° C., and an $In_{0.2}Ga_{0.8}As$ distortion active layer 12 was formed in the V-groove, and the supply of TMI was stopped. Further, trimethyl aluminum (TMA) was supplied simultaneously with TMG, and an $Al_{0.5}Ga_{0.5}As$ cladding layer 5 of 0.5 $\mu$m was formed. Next, the supply of TMA was stopped, and a GaAs cap layer 7 of 10 nm was prepared. In this case, epitaxial growth was difficult to perform on the {111} B face 6, and no growth occurred on the side walls of the V-groove. As a result, a GaAs quantum wire was formed self-matchingly at the bottom of the V-groove. By supplying HCl at a rate of about 1 sccm, i.e. by the same number of mols as that of III raw material even during growth, deposition of AlGaAs polycrystal on the silicon nitride film 8 was prevented. This method to supply HCl during growth is preferably used in case aluminum composition in the GaAlAs layer is 0.4 or more. This enables selective growth of AlGaAs having high aluminum composition, and this is effective for confinement of carriers to the active layer 12.

The sample thus grown was examined under scanning electron microscope. FIG. 3 schematically shows how it looked. Under-etching phenomenon with the etching extending under the mask of silicon nitride did not occur, and a V-groove with sharp edge was formed. Only at the bottom of this V-groove, $In_{0.2}Ga_{0.8}As$ wire was buried. In case it was grown on a flat substrate, integrated PL intensity quickly decreased when thickness of distortion quantum well was 20 nm or more, while in case of quantum wire, integratd PL intensity did not decrease up to the height of 40 nm at the tip. These results suggest that high quality quantum wire with fewer damage can be easily obtained and that critical film thickness can be increased.

(EXAMPLE 4)

Figure 7:
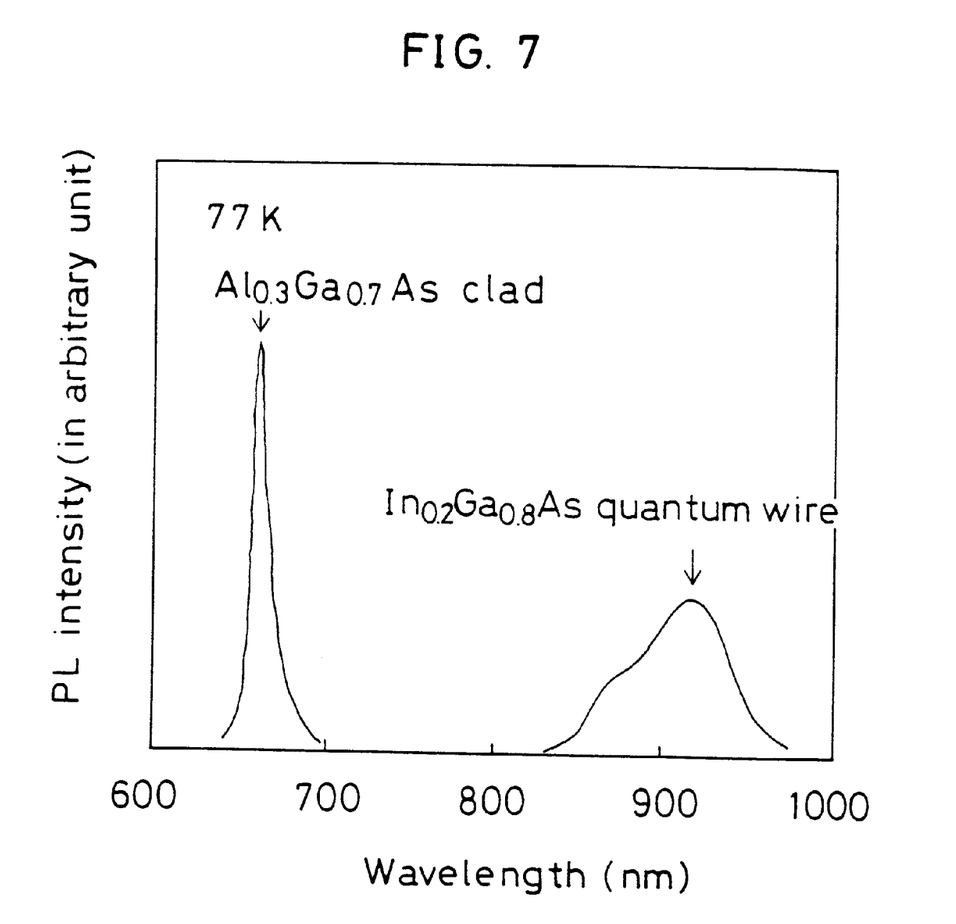
FIG. 7 shows a status of PL light emission at room temperature of a sample prepared in the embodiment 3 of the present invention.

A sample was prepared by the same procedure as in Example 3 except that the composition of the cladding layer 5 inside the V-groove was $Al_{0.3}Ga_{0.7}As$, and PL intensity was examined at 77 K. As a result, distinct light emission peaks from $In_{0.2}Ga_{0.8}As$ distortion quantum wire (40 nm in width; 18 nm in height) were found as shown in FIG. 7, and light emission intensity increased compared with that of the sample in Example 4. This may be attributable to the fact that the carriers in the V-groove could not go out of the V-groove and were concentrated on the active layer at the bottom of the V-groove because energy barrier is present on side walls of the V-groove. These results reveal that it is advantageous when preparing a laser element and the like.

(EXAMPLE 5)

First, on an n-type (100) GaAs substrate 1, an n-type GaAs buffer layer 2 (0.5 μm), an n-type $Al_{0.5}Ga_{0.5}As$ cladding layer 3 (3 μm), an undoped $Al_{0.5}Ga_{0.5}As$ high resistance cladding layer 9 (1 μm), and an undoped GaAs cap layer (0.1 μm) were formed by MOCVD method in this order. On the surface of this epitaxial substrate, silicon nitride film was formed by PCVD method, and the surface was masked by photolithography method in such manner that the silicon nitride film 8 of 2 μm in width extending in [011] direction was aligned at every 2 μm. The masked sample was set again on the MOCVD system. After setting, temperature was raised to 700° C. under arsine ($AsH_3$) atmosphere, and etching was performed using HCl gas, and a V-groove of 1.4 μm in depth having the {111} B faces 6 on both sides was formed. Immediately after etching was stopped, trimethyl gallium (TMG) was supplied with the temperature maintained at 700° C., and a GaAs quantum wire active layer 4 of 15 nm in height and 28 nm in lateral width was formed in the V-groove. Further, trimethyl aluminum (TMA) was supplied simultaneously with TMG, and a p-type $Al_{0.2}Ga_{0.8}As$ optical guiding layer 10 of 50 nm and a p-type $Al_{0.5}Ga_{0.5}As$ cladding layer 5 of 1 μm were prepared. Next, the supply of TMA was stopped, and a p-type GaAs contact layer 11 of 0.1 μm was formed. In this case, epitaxial growth was difficult to perform on the {111} B face 6, and no growth occurred on the side walls of the V-groove. As a result, GaAs quantum wire was formed self-matchingly at the bottom of the V-groove. By supplying HCl at a rate of about 1 sccm, i.e. by the same number of mols as III raw material even during the growth, deposition of AlGaAs polycrystal on the silicon nitride layer was prevented. This method to supply HCl during growth is preferably used in case aluminum composition in the GaAlAs layer is 0.4 or more. This enables selective growth of AlGaAs having high aluminum composition, and this is effective for confinement of carriers to the quantum wire active layer 4.

Electrodes are provided above and under the sample thus grown, and a laser element is prepared by cleaving to laser tips. Then, laser oscillation is obtained at a threshold as low as 1 mA.

In the above example, an active layer comprising a single quantum wire was used, whereas an active layer comprising a plurality of quantum wires may be used, sandwiching such a thin film barrier layer that quantum wires can be optically coupled.

(EXAMPLE 6)

First, on an n-type (100) GaAs substrate 1, an n-type GaAs buffer layer 2 (0.5 μm), an n-type $Al_{0.5}Ga_{0.5}As$ cladding layer 3 (2 μm), an n-type $Al_{0.2}Ga_{0.8}As$ optical guiding layer 13 (0.5 μm), an undoped $Al_{0.5}Ga_{0.5}As$ high resistance cladding layer 9 (1 μm) and an undoped GaAs cap layer 7 (0.1 μm) were formed by MOCVD method in this order. On the surface of this epitaxial substrate, silicon nitride film was formed by PCVD method, and the surface was masked by photolithography method in such manner that the silicon nitride film 8 of 2 μm in width extending in [011] direction was aligned at every 2 μm. The masked sample was set again on the MOCVD system. After the setting, temperature was raised to 700° C. under arsine ($AsH_3$) atmosphere, and the etching was performed using HCl gas, and a V-groove of 1.4 μm in depth having the {111} B faces on both sides was formed. Immediately after the etching was stopped, trimethyl gallium (TMG) was supplied while maintaining the temperature at 700° C., and a GaAs active layer 4 of 15 nm in height and 28 nm in width was formed in the V-groove. Further, trimethyl aluminum (TMA) was supplied simultaneously with TMG, and a p-type $Al_{0.2}Ga_{0.8}As$ optical guiding layer 10 of 0.3 μm and a p-type $Al_{0.5}Ga_{0.5}As$ cladding layer 5 of 1 μm were prepared. Then, the supply of TMA was stopped, and a p-type GaAs cap layer 7 of 0.1 μm was prepared. In this case, it was difficult to perform epitaxial growth on the {111} B face, and no growth occurred on the side walls of the V-groove. As a result, GaAs quantum wire was formed self-matchingly at the bottom of the V-groove. By supplying HCl at a rate of about 1 sccm, i.e. by the same number of mols as that of III raw material even during growth, deposition of AlGaAs polycrystal on the silicon nitride film 8 was prevented. This method to supply HCl during growth is preferably used when aluminum composition of the GaAlAs layer is 0.4 or more. This enables selective growth of AlGaAs having high aluminum composition, and this is effective for confinement of carriers to the quantum wire active layer.

Electrodes are provided above and under the sample thus grown, and a laser element is prepared by cleaving to laser tips. Thus, laser oscillation is obtained at a threshold as low as 1 mA. The shape of the beam was more closer to circular compared with that of Example 5.

In the above examples, an active layer comprising a single quantum wire was used, whereas an active layer comprising a plurality of quantum wires may be formed, sandwiching such a thin film barrier layer that quantum wires can be optically coupled.

As described above, it is possible according to the present invention to easily obtain quantum wire of good quality and to improve efficiency of the semiconductor device. Such semiconductor device is preferably used as a light emitting device, and by making further contrivances on the layer arrangement, it is possible to prepare a quantum laser of high quality and having light output suitable for practical application. Also, it is possible according to the present invention to easily obtain quantum wire having good quality distortion.

What we claim are:

1. A light emitting semiconductor device comprising a semiconductor substrate, a first conductivity type epitaxial layer and a second conductivity type epitaxial layer or a high resistance epitaxial layer stacked one upon another, a V-groove having a V-shaped cross-section on the semiconductor substrate, wherein an inclined surface of said V-groove is formed from the first conductivity type epitaxial layer to the second conductivity type epitaxial layer or the high resistance epitaxial layer, a bottom of the V-groove lies in said first conductivity type epitaxial layer, a side wall of the V-groove is in contact with the second conductivity type epitaxial layer or the high resistance epitaxial layer, wherein the first conductivity type epitaxial layer, the second conductivity type epitaxial layer or the high resistance layer are present outside the V-groove and an active layer is formed inside the bottom of said V-groove on the first conductivity type epitaxial layer, said active layer is sandwiched between a cladding layer inside the V-groove and the first conductive type epitaxial layer outside the V-groove, both layers being in contact with each other on a side of said V-groove and an optical guiding layer having a refractive index lower than that of said active layer and higher than that of the cladding layer inside the V-groove is formed between said active layer and said cladding layer inside said V-groove.

2. A light emitting semiconductor device according to claim 1, wherein said active layer has a quantum well structure.

3. A light emitting semiconductor device according to claim 1, wherein energy gap on the first conductive type epitaxial layer outside the V-groove is greater than energy gap on the cladding layer inside the V-groove.

4. A light emitting semiconductor device according to claim 1, wherein conductivity type of the cladding layer inside said V-groove is different from that of the first conductive type epitaxial layer outside said V-groove.

5. A light emitting semiconductor device according to claims 1 or 4, wherein conductivity type of the cladding layer inside said V-groove is identical with that of said optical guiding layer.

6. A light emitting semiconductor device according to claims 1 or 4, wherein said active layer has a quantum well structure.

7. A light emitting semiconductor device according to claim 1, wherein energy gap of the first conductive type epitaxial layer outside said V-groove is greater than energy gap of the cladding layer inside said V-groove.

8. A light emitting semiconductor device according to claim 1, wherein an inclined surface of said V-groove is a {111} B face.

9. A light emitting semiconductor device according to claim 1, wherein said V-groove is formed by vapor phase etching.

10. A light emitting semiconductor device comprising a semiconductor substrate, a first conductivity type epitaxial layer and a second conductivity type epitaxial layer or a high resistance epitaxial layer stacked one upon another, a V-groove having a V-shaped cross-section on the semiconductor substrate, wherein an inclined surface of said V-groove is formed from the first conductivity type epitaxial layer to the second conductivity type epitaxial layer or the high resistance epitaxial layer, a bottom of the V-groove lies in said first conductivity type epitaxial layer, a side wall of the V-groove is in contact with the second conductivity type epitaxial layer or the high resistance epitaxial layer, wherein the first conductivity type epitaxial layer, the second conductivity type epitaxial layer or the high resistance layer are present outside the V-groove and an active layer is formed inside the bottom of said V-groove on the first conductivity type epitaxial layer, said active layer is sandwiched between a cladding layer inside the V-groove and the first conductive type epitaxial layer outside the V-groove, both layers being in contact with each other on a side of said V-groove, wherein said active layer is strained.

11. A light emitting semiconductor device according to claim 1, wherein the first conductivity type epitaxial layer is a first conductivity type cladding layer and the second conductivity type or high resistance layer is outside the V-groove.

12. A light emitting semiconductor device according to claim 11, wherein a second optical guiding layer having refractive index lower than that of said active layer and higher than that of said third cladding layer is provided between said active layer and said third cladding layer.

13. A light emitting semiconductor device according to claims 11 or 12, wherein said first cladding layer and said first optical guiding layer are of the same first conductivity type, said third cladding layer and said second optical guiding layer are of the same second conductivity type, and said second cladding layer is of second conductivity type or has high resistance.

14. A light emitting semiconductor device according to claim 11, wherein said V-groove is formed by vapor phase etching.

15. A light emitting semiconductor device according to claim 1, wherein said light emitting semiconductor device is a laser diode.

16. A light emitting semiconductor device according to claim 1, further comprising a protective layer for the V-groove on the upper surface of the device.

* * * * *